(12) United States Patent
Tetelbaum

(10) Patent No.: US 7,213,223 B2
(45) Date of Patent: May 1, 2007

(54) METHOD OF ESTIMATING A TOTAL PATH DELAY IN AN INTEGRATED CIRCUIT DESIGN WITH STOCHASTICALLY WEIGHTED CONSERVATISM

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 206 days.

(21) Appl. No.: 10/994,114

(22) Filed: Nov. 19, 2004

(65) Prior Publication Data

US 2006/0112158 A1    May 25, 2006

(51) Int. Cl.
*G06F 17/50* (2006.01)

(52) U.S. Cl. .............................. 716/6; 716/10; 703/19; 703/16

(58) Field of Classification Search .................... 716/6; 703/19, 16
See application file for complete search history.

(56) References Cited

U.S. PATENT DOCUMENTS

| | | | | |
|---|---|---|---|---|
| 5,544,071 | A * | 8/1996 | Keren et al. .................... | 716/6 |
| 5,666,290 | A * | 9/1997 | Li et al. ......................... | 716/8 |
| 5,787,008 | A * | 7/1998 | Pullela et al. .................. | 703/19 |
| 6,526,541 | B2 * | 2/2003 | Sugibayashi ................... | 716/1 |
| 6,584,602 | B2 * | 6/2003 | Ko ................................. | 716/4 |
| 6,684,374 | B2 * | 1/2004 | Ito et al. ........................ | 716/6 |
| 6,742,133 | B2 * | 5/2004 | Saeki ........................ | 713/500 |
| 6,880,142 | B2 * | 4/2005 | Cui et al. ....................... | 716/6 |
| 7,000,205 | B2 * | 2/2006 | Devgan et al. ................. | 716/6 |
| 7,120,888 | B2 * | 10/2006 | Curtin et al. .................. | 716/10 |
| 2002/0072956 | A1 * | 6/2002 | Willems et al. ............... | 705/10 |
| 2004/0243954 | A1 * | 12/2004 | Devgan et al. ................. | 716/6 |
| 2005/0065765 | A1 * | 3/2005 | Visweswariah .............. | 703/19 |
| 2005/0243869 | A1 * | 11/2005 | Hathaway et al. ........... | 370/519 |
| 2006/0085775 | A1 * | 4/2006 | Chang et al. .................. | 716/6 |

* cited by examiner

*Primary Examiner*—Phallaka Kik
*Assistant Examiner*—Patrick Sandoval
(74) *Attorney, Agent, or Firm*—Eric James Whitesell

(57) ABSTRACT

A method and computer readable storage medium for estimating total path delay in an integrated circuit design include of receiving as input a number of stage delays and stage delay variations constituting a path in an integrated circuit design. A sum of the stage delays, a worst case sum of the stage delay variations, and a root-sum-square of the stage delay variations are calculated. A value of a weighting function is calculated as a function of the number of stage delays. A a weighted sum of the worst case sum of the stage delay variations and the root-sum-square of the stage delay variations is calculated from the weighting function. The weighted sum is generated as output to estimate total path delay.

12 Claims, 11 Drawing Sheets

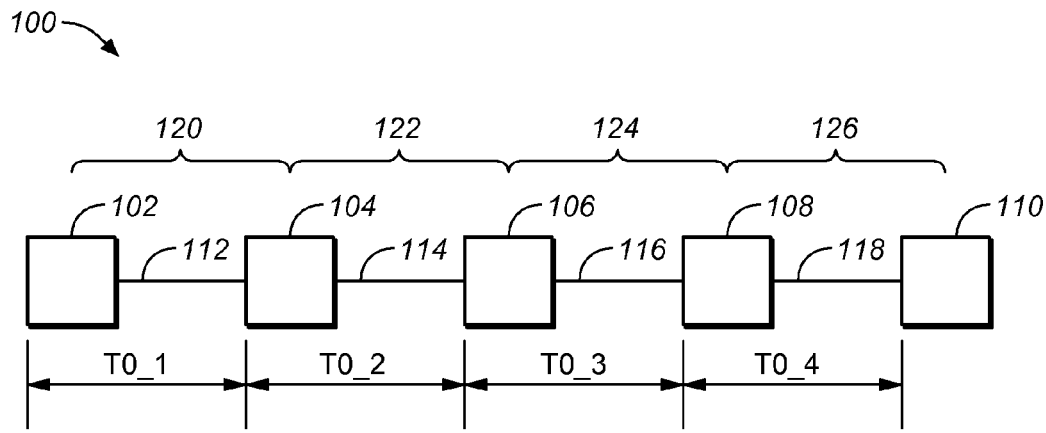
FIG._1
(PRIOR ART)
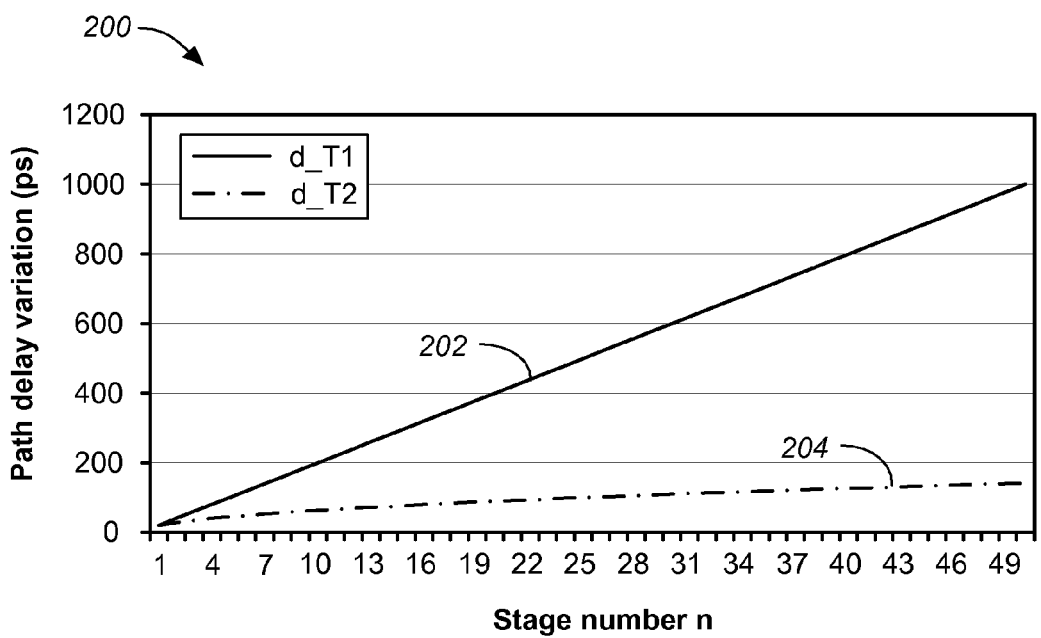
FIG._2

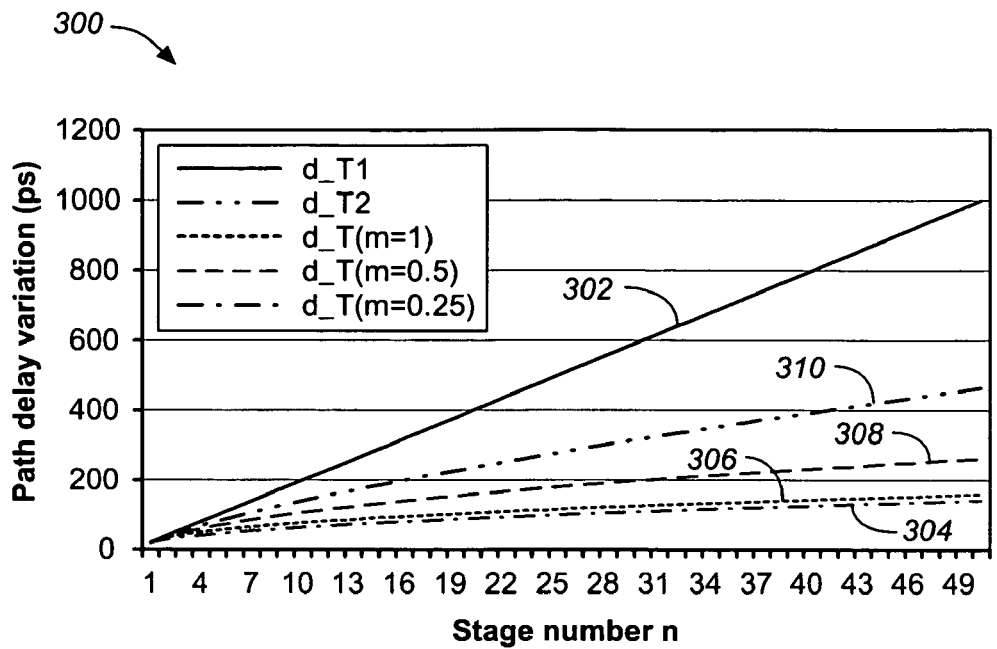
FIG. _3
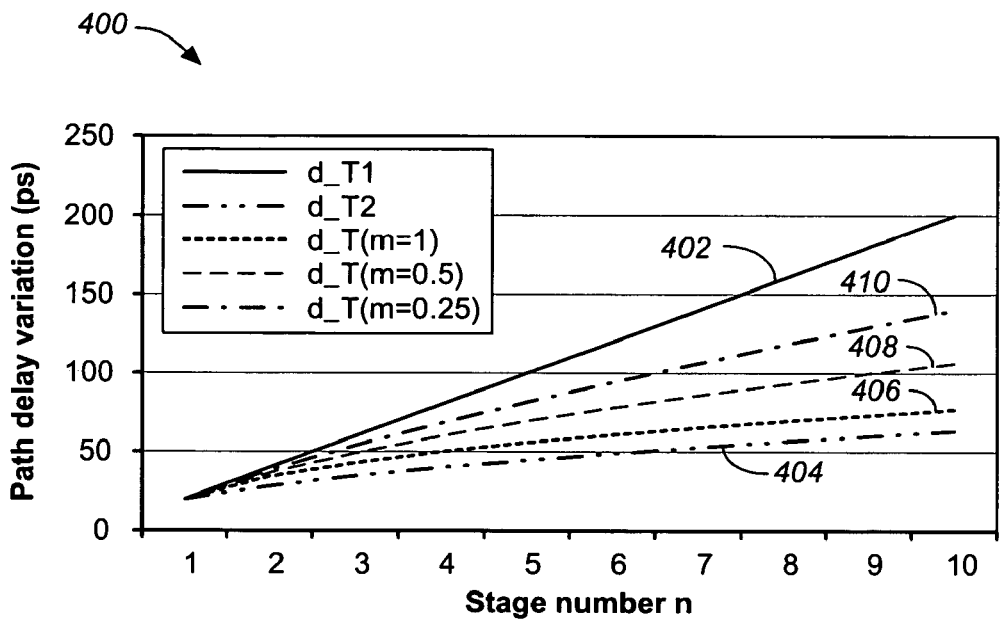
FIG. _4

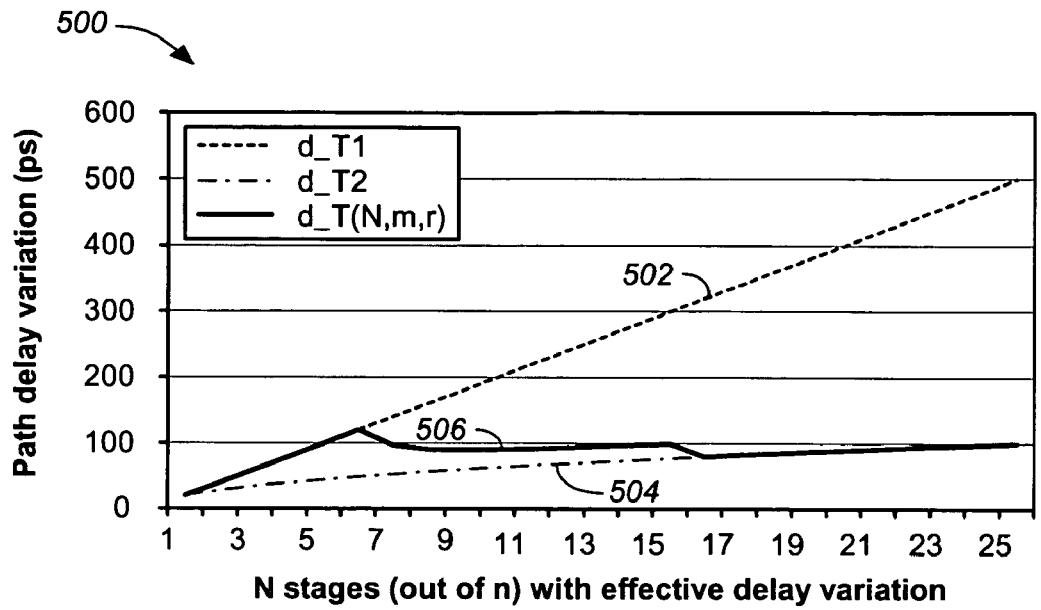
FIG._5
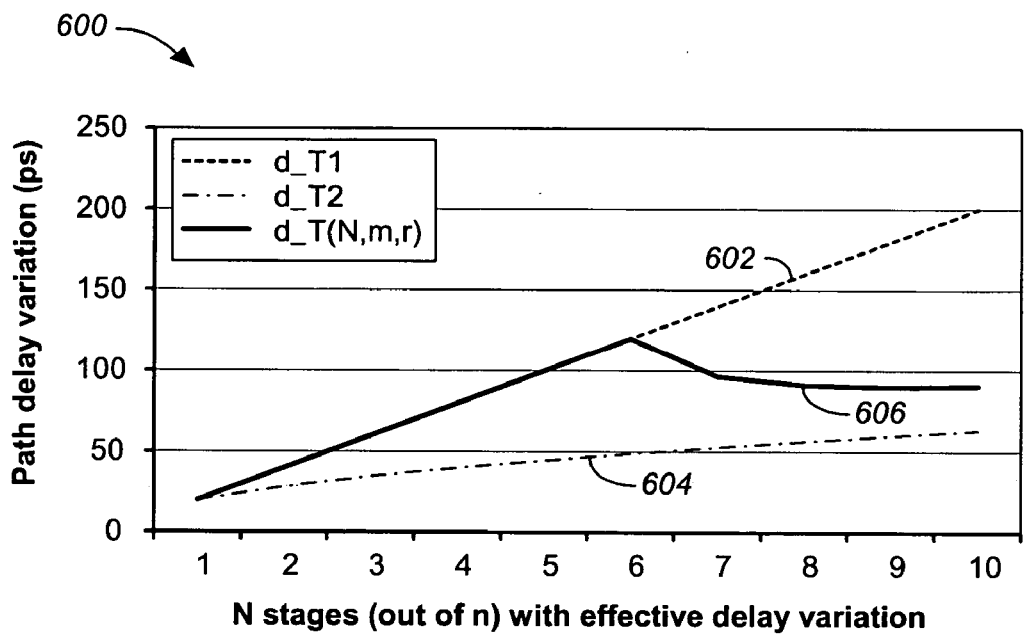
FIG._6

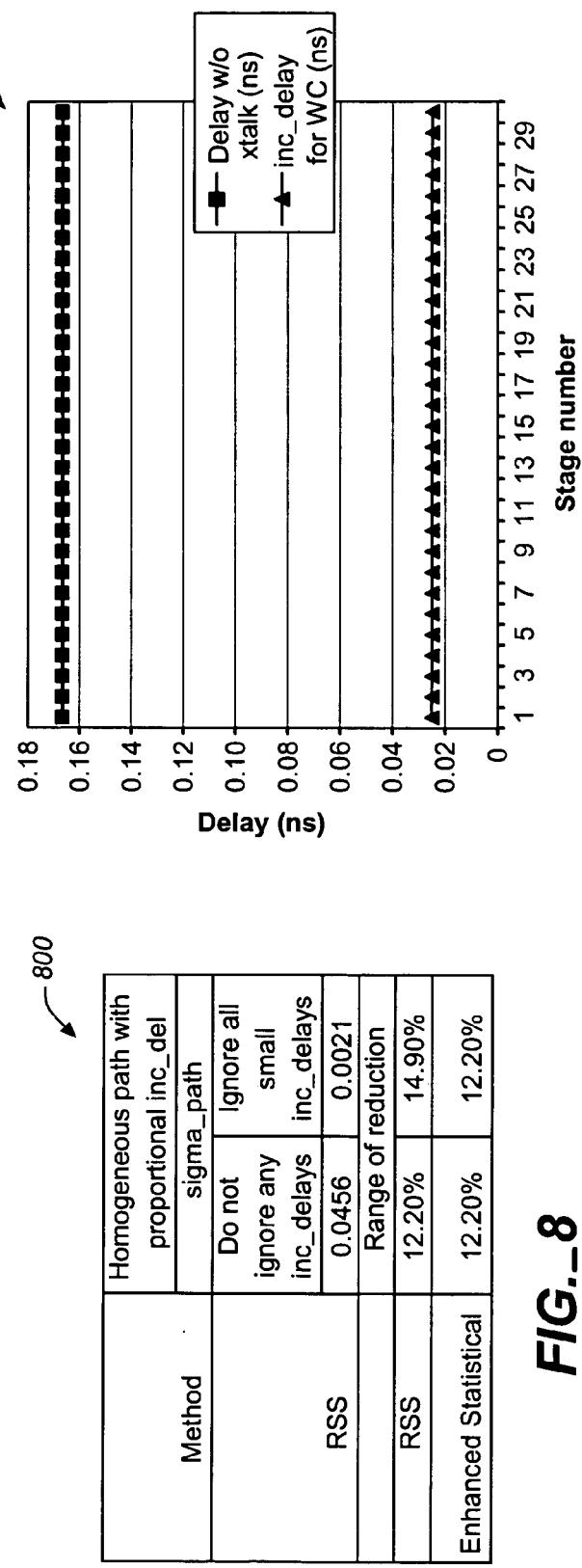
FIG._7
FIG._8
FIG._9

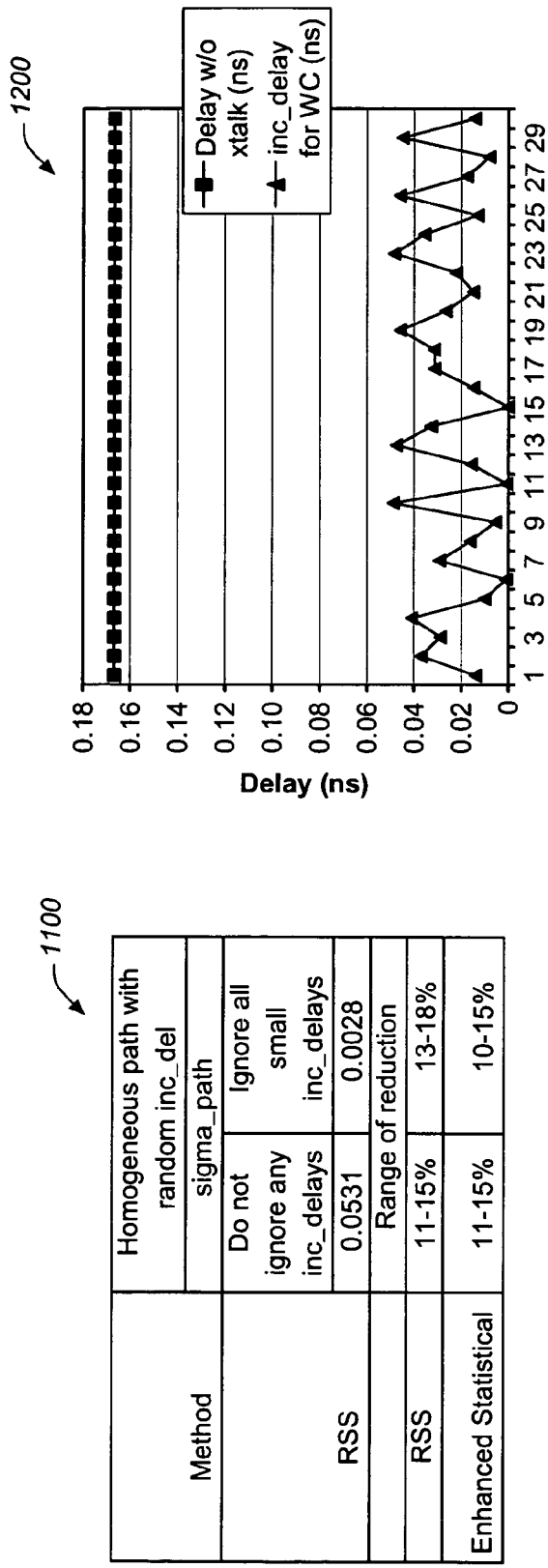
FIG._10
FIG._11
FIG._12

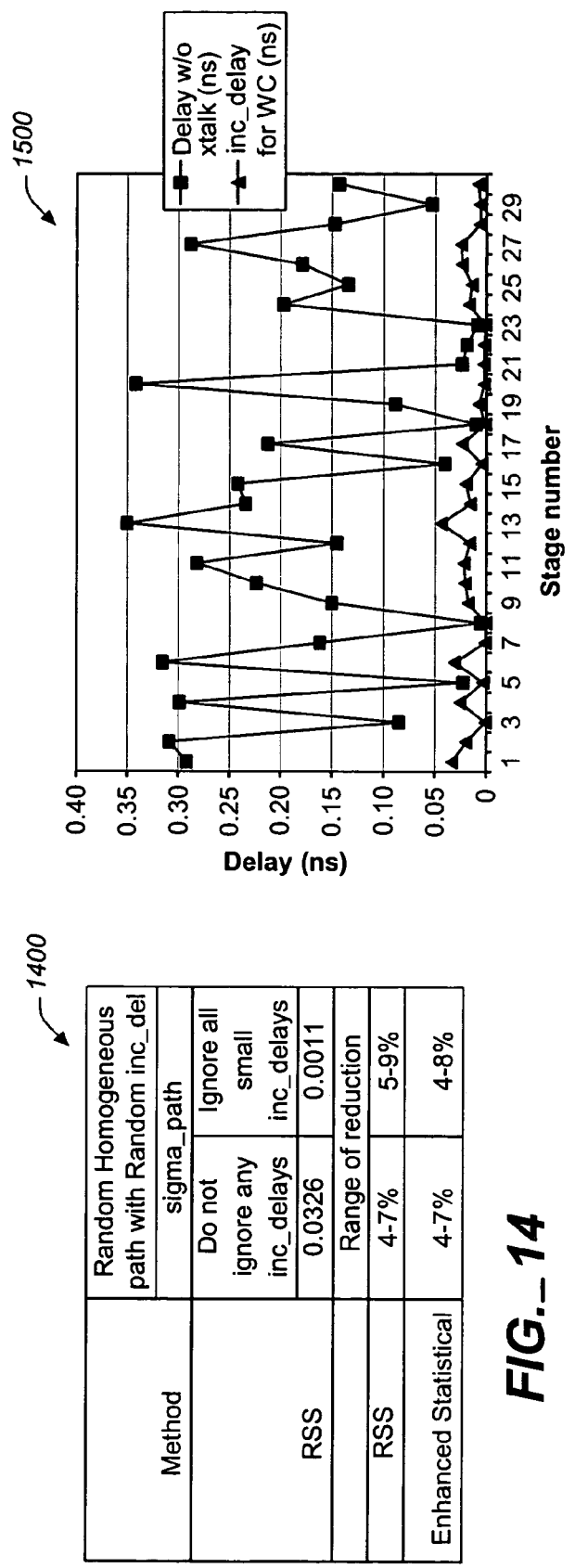
FIG._13
FIG._14
FIG._15

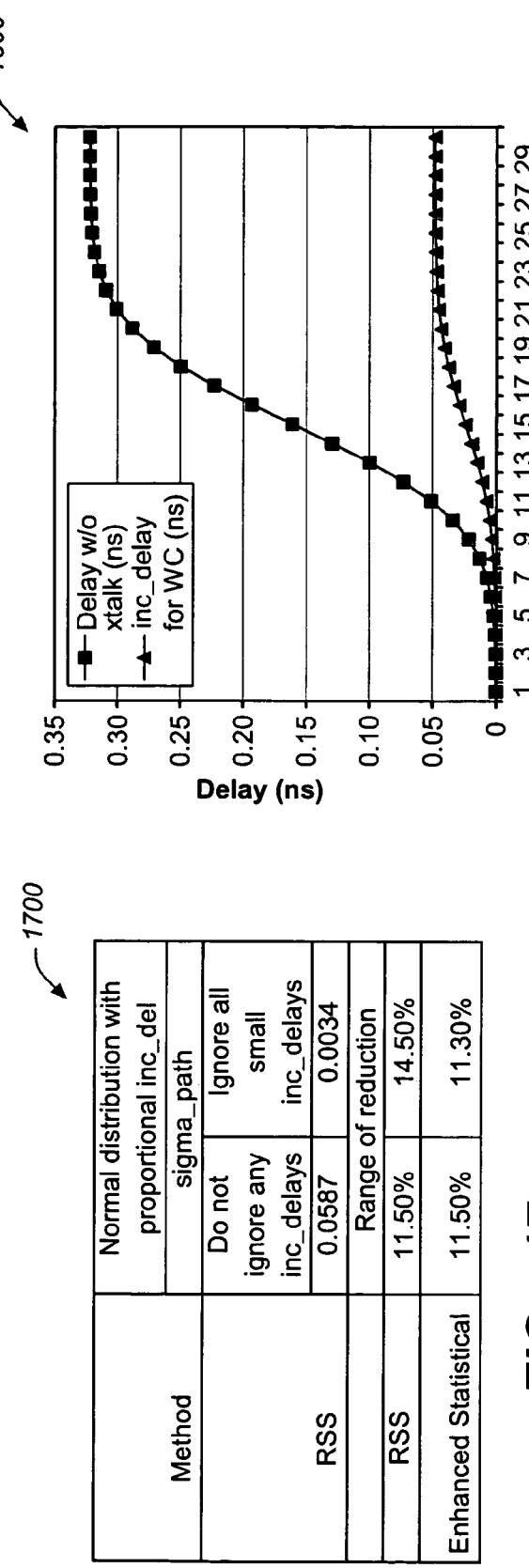
FIG._16
FIG._17
FIG._18

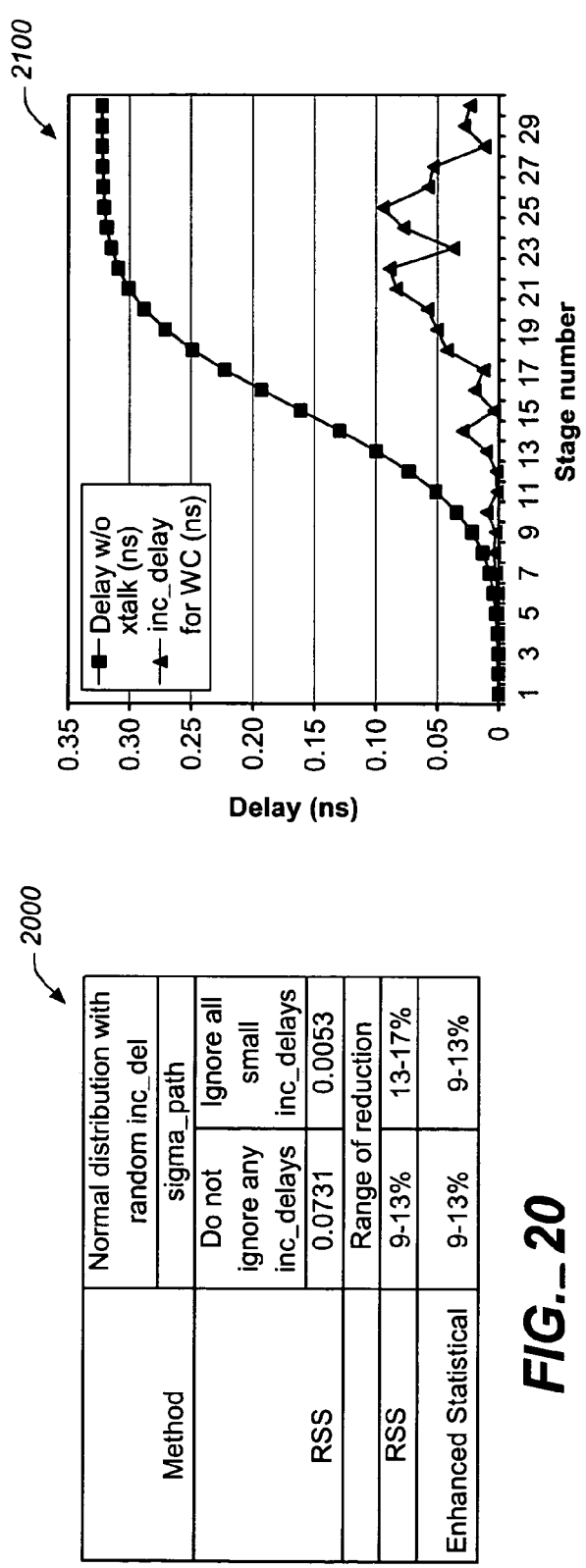
FIG._19
FIG._20
FIG._21

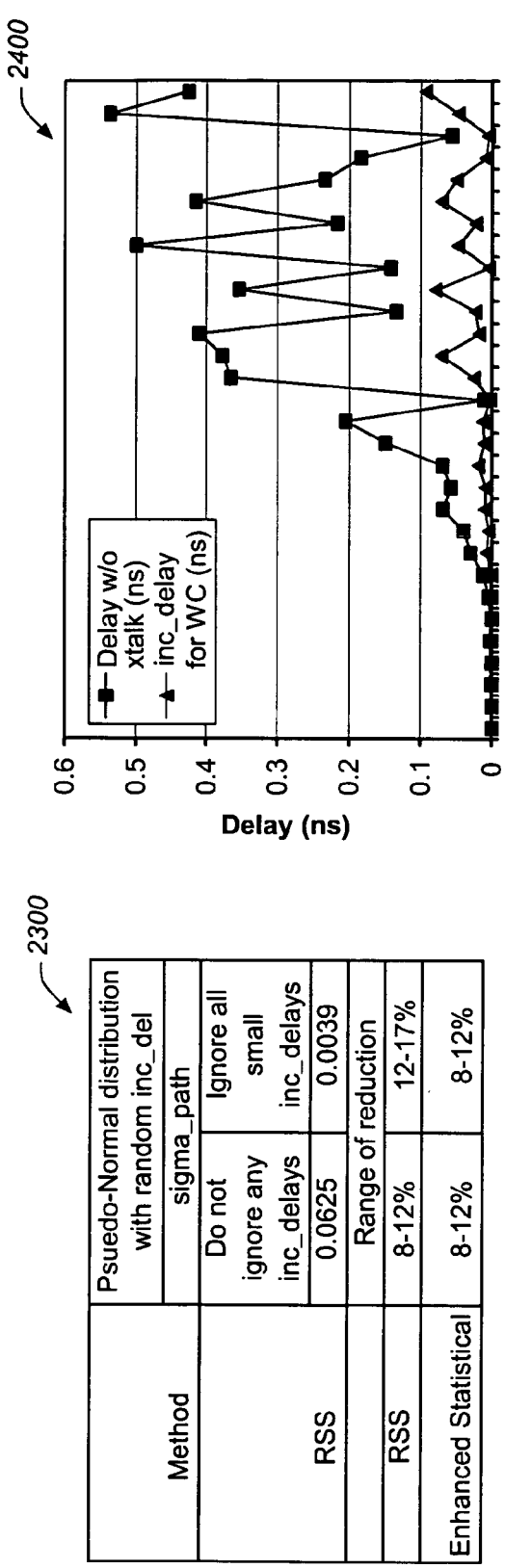
FIG._22
FIG._23
FIG._24

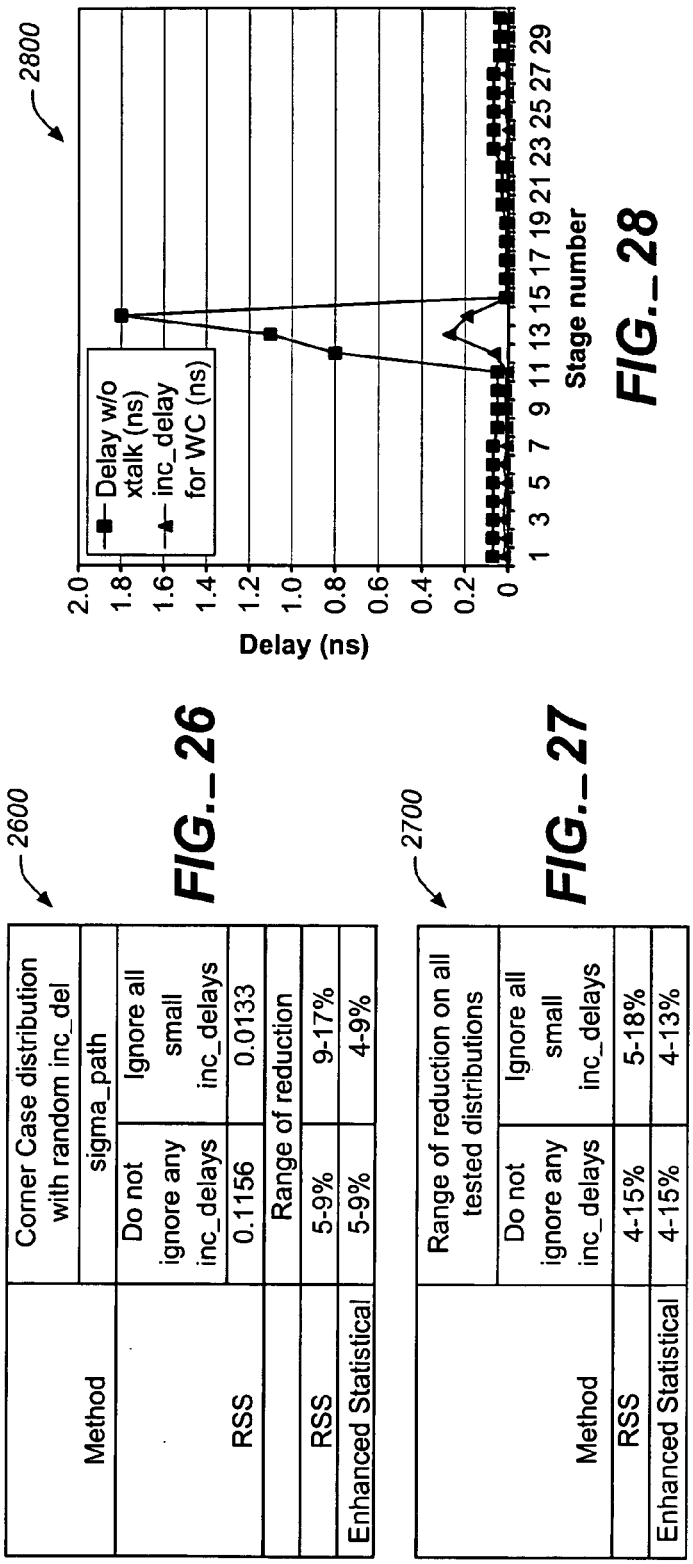
FIG._25
FIG._26
FIG._27
FIG._28

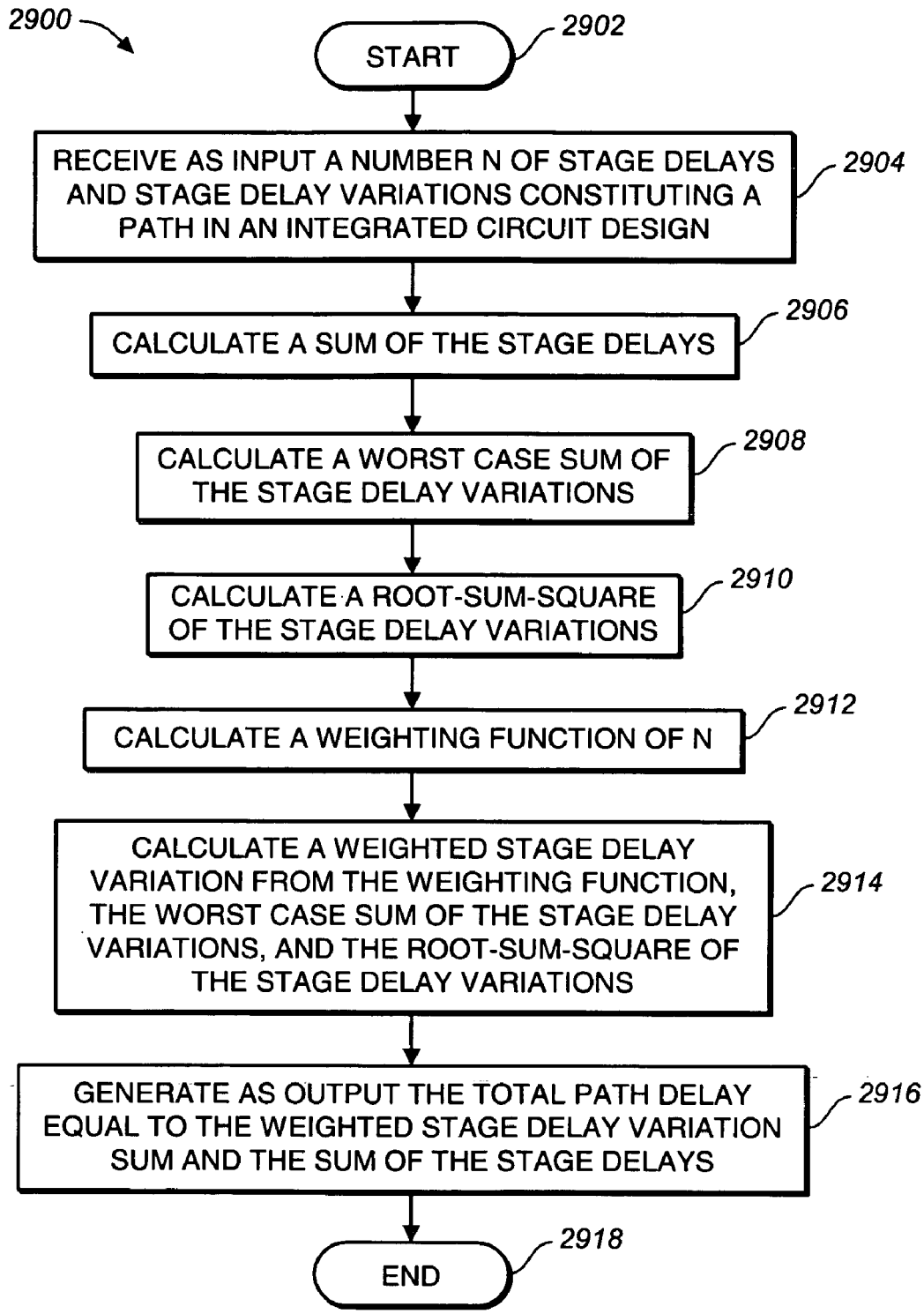
FIG._29

METHOD OF ESTIMATING A TOTAL PATH DELAY IN AN INTEGRATED CIRCUIT DESIGN WITH STOCHASTICALLY WEIGHTED CONSERVATISM

BACKGROUND OF THE INVENTION

1. Field of the Invention

The present invention is directed to integrated circuit design software used in the manufacture of integrated circuits. More specifically, but without limitation thereto, the present invention is directed to a method of statistical timing analysis of an integrated circuit design.

2. Description of Related Art

In a previous design flow used in the manufacture of integrated circuits, timing closure is performed for the integrated circuit design using a static timing analysis (STA) tool to find timing critical paths. A path is timing critical, for example, if it has a timing slack that is less than some positive limit, that is, the propagation delay of the path may not meet setup or hold time specifications due to the effect of crosstalk delay.

SUMMARY OF THE INVENTION

In one aspect of the present invention, a method includes steps of:

(a) receiving as input a number of stage delays and stage delay variations constituting a path in an integrated circuit design;

(b) calculating a sum of the stage delays;

(c) calculating a worst case sum of the stage delay variations;

(d) calculating a root-sum-square of the stage delay variations;

(e) calculating a value of a weighting function of the number of stage delays;

(f) calculating a weighted sum of the worst case sum of the stage delay variations and the root-sum-square of the stage delay variations from the weighting function; and (g) generating as output the weighted sum as a total path delay.

In another aspect of the present invention, a computer program product for estimating a total path delay in an integrated circuit design includes:

a medium for embodying a computer program for input to a computer; and a computer program embodied in the medium for causing the computer to perform steps of:

(a) receiving as input a number of stage delays and stage delay variations constituting a path in an integrated circuit design;

(b) calculating a sum of the stage delays;

(c) calculating a worst case sum of the stage delay variations;

(d) calculating a root-sum-square of the stage delay variations;

(e) calculating a value of a weighting function of the number of stage delays;

(f) calculating a weighted sum of the worst case sum of the stage delay variations and the root-sum-square of the stage delay variations from the weighting function; and (g) generating as output the weighted sum as a total path delay.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates an example of a path in an integrated circuit design according to the prior art;

FIG. 2 illustrates a graph of estimated path delay variation as a function of the number of path stages for the summed method and for the root-sum-square method.

FIG. 3 illustrates a graph of estimated path delay variation vs. the number of path stages for a proposed weighted method;

FIG. 4 illustrates an enlarged view of the graph of FIG. 3 for small values of the number of path stages n;

FIG. 5 illustrates a graph of path delay variation as a function of the number of effective variations N;

FIG. 6 illustrates an enlarged view of the graph of FIG. 5 for small values of the number of path stages n;

FIG. 7 illustrates a table of conservatism reduction for a constant stage delay and a constant stage delay variation;

FIG. 8 illustrates a table of range of conservatism reduction for the example of FIG. 7;

FIG. 9 illustrates a graph of the distribution of stage delay and stage delay variation for the example of FIG. 7;

FIG. 10 illustrates a table of conservatism reduction for a constant stage delay and a random stage delay variation;

FIG. 11 illustrates a table of range of conservatism reduction for the example of FIG. 10;

FIG. 12 illustrates a graph of the distribution of stage delay and stage delay variation for the example of FIG. 10;

FIG. 13 illustrates a table of conservatism reduction for a random distribution of stage delays and stage delay variations;

FIG. 14 illustrates a table of range of conservatism reduction for the example of FIG. 13;

FIG. 15 illustrates a graph of the distribution of stage delay and stage delay variation for the example of FIG. 13;

FIG. 16 illustrates a table of conservatism reduction for a stage delay and a stage delay variation as a normal distribution of the stage number;

FIG. 17 illustrates a table of range of conservatism reduction for the example of FIG. 16;

FIG. 18 illustrates a graph of the distribution of stage delay and stage delay variation for the example of FIG. 16;

FIG. 19 illustrates a table of conservatism reduction for a stage delay as a normal distribution of the stage number and a random stage delay variation;

FIG. 20 illustrates a table of range of conservatism reduction for the example of FIG. 19;

FIG. 21 illustrates a graph of the distribution of stage delay and stage delay variation for the example of FIG. 19;

FIG. 22 illustrates a table of conservatism reduction for a stage delay and a stage delay variation as a pseudo-normal distribution of the stage number and a random stage delay variation;

FIG. 23 illustrates a table of range of conservatism reduction for the example of FIG. 22;

FIG. 24 illustrates a graph of the distribution of stage delay and stage delay variation for the example of FIG. 22;

FIG. 25 illustrates a table of conservatism reduction for a stage delay and a stage delay variation as a corner distribution of the stage number;

FIG. 26 illustrates a table of range of conservatism reduction for the example of FIG. 25;

FIG. 27 illustrates a graph of the distribution of stage delay and stage delay variation for the example of FIG. 25;

FIG. 28 illustrates a summary of the reduction in conservatism illustrated in FIGS. 7–27 and from various other distributions for the root-sum-square method and the enhanced weighted method; and FIG. 29 illustrates a flow chart for a method of estimating total path delay with stochastically weighted conservatism.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

In previous methods of static timing analysis, the sum of the delays is calculated for each cell and each interconnect along each path of the integrated circuit design. To ensure that timing specifications are met, a conservative estimate of stage delay, that is, the cell delay plus the interconnect delay, includes a mean or typical value plus a delay variance that depends on process/voltage/temperature (PVT) variation and crosstalk variation. For extremely long paths with a large number of cells, this approach may become excessively conservative, because it is assumed that the delay variance for each cell has a worst case value. As a result, the estimated design performance is poorer than the actual design performance, and false timing violations may be reported by the static analysis tool. Correction of these false timing violations requires unnecessary reiterations of the integrated circuit design that generate costly increases in the turnaround time. Also, the design may be signed off with a performance rating that is less than the actual performance rating.

Several methods have been proposed for statistical delay calculations to address at least the process variations, however, these methods have several disadvantages, for example: extremely long run time requirements, instability, lack of industry acceptance, and a large number of simplifications, heuristics, limits, estimates, and assumptions that erode the accuracy of the timing calculation.

In one embodiment, a method of estimating a total path delay in an integrated circuit design includes steps of:

(a) receiving as input a number of stage delays and stage delay variations constituting a path in an integrated circuit design;

(b) calculating a sum of the stage delays;

(c) calculating a worst case sum of the stage delay variations;

(d) calculating a root-sum-square of the stage delay variations;

(e) calculating a value of a weighting function of the number of stage delays;

(f) calculating a weighted sum of the worst case sum of the stage delay variations and the root-sum-square of the stage delay variations from the weighting function; and (g) generating as output the weighted sum as a total path delay.

A proposed method of calculating a total path delay in an integrated circuit design that is less conservative than previous methods while avoiding timing failure in silicon due to stage delay variances receives as input the empirically derived values of typical stage delays and stage delay variations for each stage in a path of an integrated circuit design. A stage delay is the cell delay plus the interconnect delay for a selected cell in a path.

FIG. 1 illustrates an example of a path 100 in an integrated circuit design according to the prior art. Shown in FIG. 1 are cells 102, 104, 106, 108, and 110, interconnects 112, 114, 116, and 118, stages 120, 122, 124, and 126, and stage delays T0_1, T0_2, T0_3, and T0_4.

The typical value of the stage delay does not include the stage delay variation. The value of the stage delay variation includes the effects of process/voltage/temperature variation and crosstalk variation. Previous timing analysis tools use the following equation to calculate path delay:

$$T = T1 = \sum_{j=1}^{n} (T0\_j + d\_T\_j) \tag{1}$$

where:

T is the total delay for a path P;

T1 is the sum of the stage delays plus the sum of the stage delay variations along the path P;

T0_j is the typical value of stage delay for a stage j in the path P not including stage delay variation;

d_T_j is the stage delay variation for a stage j in the path P; and n is the number of stages in the path P.

Equation (1) may be rewritten as $$T=T1=T0+d\_T1 \tag{2}$$

where T0 is the summed stage delay (not including stage delay variation) given by $$T0 = \sum_{j=1}^{n} T0\_j \tag{3}$$

and d_T1 is the summed stage delay variation along the path P given by $$d\_T1 = \sum_{j=1}^{n} d\_T\_j \tag{4}$$

The path delay T1 is the worst case (WC) estimate of the path delay, that is, each stage delay T_j=T0_j+d_T_j has the maximum possible value.

To reduce the conservatism of the worst case estimate of the path delay, the root-sum-square (RSS) of the stage delay variation may be calculated according to $$T=T2=T0+d\_T2 \tag{5}$$

where:

T2 is the sum of the stage delays plus the root-sum-square of the stage delay variations along the path P; and d_T2 is the root-sum-square stage delay variation along the path P given by:

$$d\_T2 = \sqrt{\sum_{j=1}^{n} (d\_T\_j)^2} \tag{6}$$

Comparing the root-sum-square method to the worst case method, T2 is less conservative than T1, that is, T2 is always less than T1, except in the case where d_T2 is equal to zero, in which case T2 is equal to T1. The root-sum-square method provides accurate results if the following conditions are true:

(1) the number of stages n exceeds a minimum threshold, for example, 20;

(2) all stage delay variances are independent random variables;

(3) each of the stage delay variations has a normal distribution with an extreme value at about three sigma of the distribution and a typical value at about the mean of the distribution;

(4) if the stage delay variations do not have a normal distribution, then the path delay will have a normal distribution if the number of stages n exceeds a maximum threshold, for example, 30, according to the central limit theorem in probability theory.

A disadvantage of using the root-sum-square method for timing analysis is that there are typically many timing critical paths in an integrated circuit design where n is less than 20. A path is timing critical to the setup time requirement if the propagation delay of the path is more than an empirical threshold, typically about 90 percent, of the clock period. Equivalently, the path has a timing slack of less than 10 percent of the clock period. For timing critical paths where n is less than the minimum threshold, there is a significant probability that the actual path delay may exceed the estimated maximum delay during the expected chip lifetime, resulting in a timing violation and possibly a performance failure.

FIG. 2 illustrates a graph 200 of estimated path delay variation as a function of the number of path stages for the summed method and for the root-sum-square method. Shown in FIG. 2 are a plot 202 for the summed method of equation (4) and a plot 204 for the root-sum-square method of equation (6).

In FIG. 2, all the path stages have the same delay variation. As the number of stages increases, the relative conservatism of the summed (WC) method compared to the root-sum-square (RSS) method becomes more apparent. Accordingly, if the summed method of equation (4) is used, then the estimated total path delay may be excessively conservative for long paths, that is, for n greater than, for example, 10. On the other hand, if the root-sum-square method of equation (6) is used, then there is a significant risk that a timing violation may be missed, especially for short paths, that is, for n less than, for example, 20.

The disadvantages of the summed method and the root-sum-square method described above may be overcome by calculating a weighted sum of the stage delay variations as follows. For small values of n, the weighted sum d_T approaches the value of the summed stage delay variations d_T1. For large values of n, the weighted sum d_T approaches the value of the root-mean-square of the stage delay variations d_T2. An example of an equation that implements the proposed weighted method is given by:

$$T = T0 + d\_T \quad (7)$$

where:

$$d\_T = K(n)d\_T1 + [1 - K(n)]d\_T2 \quad (8)$$

and K(n) is a weighting function of the number of stage delays, for example, $$K(n) = \frac{1}{n^m} \quad (9)$$

where $0 < m \leq 1$. If the value of m is selected close to zero, then d_T is weighted more heavily to d_T1. On the other hand, if the value of m is selected close to one, then d_T is weighted more heavily to d_T2.

FIG. 3 illustrates a graph 300 of estimated path delay variation vs. the number of path stages for the proposed weighted method. Shown in FIG. 3 are a plot 302 for the summed method of equation (4), a plot 304 for the root-sum-square method of equation (6), a plot 306 for the weighted method of equation (8) with m=1, a plot 308 for the weighted method with m=0.5, and a plot 310 for the weighted method with m=0.25.

In FIG. 3, all the path stages have the same delay variation as in FIG. 2. However, the conservatism of the estimated path delay in FIG. 3 is controlled by the value of m, especially at larger values of the number of path stages n, as may be appreciated from the plots 306, 308, and 310.

FIG. 4 illustrates an enlarged view 400 of the graph of FIG. 3 for small values of the number of path stages n. Shown in FIG. 4 are a plot 402 for the summed method of equation (4), a plot 404 for the root-sum-square method of equation (6), a plot 406 for the weighted method of equation (8) with m=1, a plot 408 for the weighted method with m=0.5, and a plot 410 for the weighted method with m=0.25.

In practice, stage delay variations are not all the same as illustrated in the graphs of FIGS. 2–4. However, only a certain number N out of all the n stages have delay variations that contribute significantly to the calculation of the total path delay. For example, if the ratio of the stage delay variation d_T_j to the summed stage delay T0 is less than a selected minimum ratio, for example, 0.001, then that stage delay may be omitted from the calculation of d_T. The stage delay variations that exceed the selected minimum ratio are referred to herein as effective variations.

Also, to reduce the risk of a timing violation for small values of n while preserving the less conservative root-sum-square method for large values of n, equation (9) may be enhanced as follows:

$$K(n) = \begin{cases} 1 & \text{if } n \leq r \\ \frac{1}{(n-r)^m} & \text{if } n > r \\ 0 & \text{if } n > r\_up \end{cases} \quad (10)$$

where r and r_up are constants determined by the acceptable risk. For example, if r is equal to 7, and r_up is equal to 15, then d_T is calculated according to the summed method of equation (4) for $n \leq 7$. If $7 < n \leq 15$, then d_T is calculated according to the weighted method of equation (8). If n>15, then d_T is calculated according to the root-sum-square method of equation (6).

Other weighting schemes may be used to calculate d_T as a function of d_T1 and d_T2 according to equation (8), where K(n) may be any weighting function of n such that $0 \leq K(n) \leq 1$.

FIG. 5 illustrates a graph 500 of path delay variation as a function of the number of effective variations N. Shown in FIG. 5 are a plot 502 of d_T1, a plot 504 of d_T2, and a plot 506 of d_T calculated according to the enhanced weighted method of equation (10).

In FIG. 5, the most conservative summed method is used to estimate path delay variation for N≦7, the moderately conservative weighted method is used to estimate path delay variation for 7<N≦15, and the least conservative root-sum-square method is used to estimate path delay variation for N>15.

FIG. 6 illustrates an enlarged view 600 of the graph of FIG. 5 for small values of the number of path stages n. Shown in FIG. 6 are a plot 602 of d_T1, a plot 604 of d_T2, and a plot 606 of d_T calculated according to the enhanced weighted method of equation (10).

In the following figures, the reduction in conservatism realized by the enhanced weighted method (enhanced statistical) of equation (10) and the root-sum-square method (RSS) of equation (6) compared to the summed method (WC) of equation (4) used in previous statistical timing analysis tools is considered for several practical examples. The reduction in conservatism is defined herein as the difference in total path delay between the summed method and the enhanced weighted method divided by the sum of the stage delays T0. The range of reduction is the range for conservatism reductions collected for 1,000 paths selected randomly with various types of distributions. The results for each type of distribution is tabulated from only the effective variations (ignore small inc_delays) and from all stage delay variations (do not ignore any inc_delays).

FIG. 7 illustrates a table 700 of conservatism reduction for a constant stage delay and a constant stage delay variation. In this example, the reduction in conservatism for the enhanced weighted method is about 12 percent from the worst-case method.

FIG. 8 illustrates a table 800 of range of conservatism reduction for the example of FIG. 7.

FIG. 9 illustrates a graph 900 of the distribution of stage delay and stage delay variation for the example of FIG. 7.

FIG. 10 illustrates a table 1000 of conservatism reduction for a constant stage delay and a random stage delay variation. In this example, the reduction in conservatism for the enhanced weighted method is about 11 percent from the worst-case method.

FIG. 11 illustrates a table 1100 of range of conservatism reduction for the example of FIG. 10.

FIG. 12 illustrates a graph 1200 of the distribution of stage delay and stage delay variation for the example of FIG. 10.

FIG. 13 illustrates a table 1300 of conservatism reduction for a random distribution of stage delays and stage delay variations. In this example, the reduction in conservatism for the enhanced weighted method is about 6 percent from the worst-case method.

FIG. 14 illustrates a table 1400 of range of conservatism reduction for the example of FIG. 13.

FIG. 15 illustrates a graph 1500 of the distribution of stage delay and stage delay variation for the example of FIG. 13.

FIG. 16 illustrates a table 1600 of conservatism reduction for a stage delay and a stage delay variation as a normal distribution of the stage number. In this example, the reduction in conservatism for the enhanced weighted method is about 11 percent from the worst-case method.

FIG. 17 illustrates a table 1700 of range of conservatism reduction for the example of FIG. 16.

FIG. 18 illustrates a graph 1800 of the distribution of stage delay and stage delay variation for the example of FIG. 16.

FIG. 19 illustrates a table 1900 of conservatism reduction for a stage delay as a normal distribution of the stage number and a random stage delay variation. In this example, the reduction in conservatism for the enhanced weighted method is about 11 percent from the worst-case method.

FIG. 20 illustrates a table 2000 of range of conservatism reduction for the example of FIG. 19.

FIG. 21 illustrates a graph 2100 of the distribution of stage delay and stage delay variation for the example of FIG. 19.

FIG. 22 illustrates a table 2200 of conservatism reduction for a stage delay and a stage delay variation as a pseudo-normal distribution of the stage number and a random stage delay variation. In this example, the reduction in conservatism for the enhanced weighted method is about 9 percent from the worst-case method.

FIG. 23 illustrates a table 2300 of range of conservatism reduction for the example of FIG. 22.

FIG. 24 illustrates a graph 2400 of the distribution of stage delay and stage delay variation for the example of FIG. 22.

FIG. 25 illustrates a table 2500 of conservatism reduction for a stage delay and a stage delay variation as a corner distribution of the stage number. In this example, the reduction in conservatism for the enhanced weighted method is about 7 percent from the worst-case method.

FIG. 26 illustrates a table 2600 of range of conservatism reduction for the example of FIG. 25.

FIG. 27 illustrates a graph 2700 of the distribution of stage delay and stage delay variation for the example of FIG. 25.

FIG. 28 illustrates a table 2800 summarizing the reduction in conservatism illustrated in FIGS. 7–27 and from various other distributions for the root-sum-square method and the enhanced weighted method. In general, the reduction in conservatism is smaller for low values of d_T and is larger for high values of d_T for any distribution of stage delay variations.

FIG. 29 illustrates a flow chart 2900 for a method of estimating total path delay in an integrated circuit design with stochastically weighted conservatism.

Step 2902 is the entry point of the flow chart 2900.

In step 2904, a number n of stage delays and stage delay variations constituting a path in an integrated circuit design is received as input. If weighting constants are used to calculate the weighting function K(n), they may also be received as input.

In step 2906, a sum of the stage delays T0 is calculated, for example, according to equation (3).

In step 2908, a worst case sum of the stage delay variations d_T1 is calculated, for example, according to equation (4).

In step 2910, a root-sum-square of the stage delay variations d_T2 is calculated, for example, according to equation (6). To reduce the number of calculations, each stage delay variation having a value less than a selected minimum ratio of the value of the stage delay variation to the sum of the stage delays may be omitted from the calculation of the root sum square of the stage delay variations. For example, if the selected minimum ratio is 0.001, and if the sum of the stage delays is equal to 435 nanoseconds, then the ratio of a stage delay variation having a value of 0.4 nanoseconds to the sum of the stage delays would be (0.4 ns/435 ns<0.001), therefore the stage delay variation may be omitted from the calculation of the root-sum-square of the stage delay variations. On the other hand, the ratio of a stage delay variation having a value of 0.5 nanoseconds to the sum of the stage delays would be greater than the selected ratio of 0.001 and would therefore be included in the calculation of the root-sum-square of the stage delay variations.

In step 2912, a weighting function K(n) of the number of stage delays n is calculated, for example, according to equation (9) or equation (10) such that $0 \leq K(n) \leq 1$.

In step 2914, a weighted stage delay variation sum d_T is calculated from the weighting function K(n), the worst case sum of the stage delay variations d_T1, and the root-sum-square of the stage delay variations d_T2, for example, according to equation (8).

In step 2916, the total path delay equal to the weighted stage delay variation sum d_T and the sum of the stage delays T0 is generated as output.

Step 2918 is the exit point of the flow chart 2900.

As may be appreciated from the above description, the proposed method of statistical timing analysis with reduced conservatism provides a significant reduction of path delay conservatism compared to the worst case method previously used in static timing analysis. By appropriate selection of r, r_up, and m, the risk of failing to recognize a timing violation may be advantageously avoided without underrating the performance of an integrated circuit design, and the run time required for the method of statistical timing analysis described above is only about 0.5 percent more than for static timing analysis.

Although the method illustrated by the flowchart descriptions above is described and shown with reference to specific steps performed in a specific order, these steps may be combined, sub-divided, or reordered without departing from the scope of the claims. Unless specifically indicated herein, the order and grouping of steps is not a limitation of the present invention.

The flow chart described above may also be implemented by instructions for being performed on a computer. The instructions may be embodied in a disk, a CD-ROM, and other computer readable media according to well known computer programming techniques.

In another embodiment, a computer program product for estimating a total path delay in an integrated circuit design includes:

a medium for embodying a computer program for input to a computer; and a computer program embodied in the medium for causing the computer to perform steps of:

(a) receiving as input a number n of stage delays and stage delay variations constituting a path in an integrated circuit design;

(b) calculating a sum of the stage delays;

(c) calculating a worst case sum of the stage delay variations;

(d) calculating a root-sum-square of the stage delay variations;

(e) calculating a value of a weighting function of the number of stage delays;

(f) calculating a weighted sum of the worst case sum of the stage delay variations and the root-sum-square of the stage delay variations from the weighting function; and (g) generating as output the weighted sum as a total path delay.

While the invention herein disclosed has been described by means of specific embodiments and applications thereof, numerous modifications and variations could be made thereto by those skilled in the art without departing from the scope of the invention set forth in the following claims.

What is claimed is:

1. A method for estimating total path delay in an integrated circuit design comprising steps of:
    (a) receiving as input a number of stage delays and stage delay variations constituting a path in an integrated circuit design;
    (b) calculating a sum of the stage delays;
    (c) calculating a worst case sum of the stage delay variations;
    (d) calculating a root-sum-square of the stage delay variations;
    (e) calculating a value of a weighting function as a function of the number of stage delays;
    (f) calculating a weighted sum of the worst case sum of the stage delay variations and the root-sum-square of the stage delay variations from the weighting function; and
    (g) generating as output the weighted sum to estimate total path delay.

2. The method of claim 1 wherein the weighting function in step (e) is calculated according to the equation $$K(n) = \frac{1}{n^m}$$

wherein K(n) is the weighting function, n is the number of stage delays, and $0 < m \leq 1$.

3. The method of claim 2 wherein the weighted sum in step (f) is calculated according to the equation $$d\_T = K(n)d\_T1 + [1 - K(n)]d\_T2$$

wherein
    d_T is the weighted sum,
    d_T1 is worst case sum of the stage delay variations, and
    d_T2 is the root-mean-square of the stage delay variations.

4. The method of claim 1 wherein the weighting function in step (e) is calculated according to the equation $$K(n) = \begin{cases} 1 & \text{if} \quad n \leq r \\ \frac{1}{(n-r)^m} & \text{if} \quad n > r \\ 0 & \text{if} \quad n > \text{r\_up} \end{cases}$$

wherein r and r_up are integers such that $0 < r < \text{r\_up} < n$, K(n) is the weighting function, n is a number of stage delays, and $0 < m \leq 1$.

5. The method of claim 1 wherein step (d) comprises omitting, from the calculation of the root sum square of the stage delay variations, each stage delay variation having a value less than a selected minimum ratio of the value of the stage delay variation to the sum of the stage delays.

6. The method of claim 5 wherein the selected minimum ratio has a value equal to about 0.001.

7. A computer readable storage medium tangibly embodying instructions for a computer that when executed by the computer implement a method for estimating total path delay in an integrated circuit design, the method comprising steps of:
    (a) receiving as input a number of stage delays and stage delay variations constituting a path in an integrated circuit design;

(b) calculating a sum of the stage delays;
(c) calculating a worst case sum of the stage delay variations;
(d) calculating a root-sum-square of the stage delay variations;
(e) calculating a value of a weighting function as a function of the number of stage delays;
(f) calculating a weighted sum of the worst case sum of the stage delay variations and the root-sum-square of the stage delay variations from the weighting function; and
(g) generating as output the weighted sum to estimate total path delay.

8. The computer readable storage medium of claim 7 wherein the weighting function in step (e) is calculated according to the equation $$K(n) = \frac{1}{n^m}$$

wherein $K(n)$ is the weighting function, n is a number of stage delays, and $0<m\leq 1$.

9. The computer readable storage medium of claim 8 wherein the weighted sum in step (f) is calculated according to the equation $$d\_T = K(n)d\_T1 + [1-K(n)]d\_T2$$

wherein
d_T is the weighted sum,
d_T1 is worst case sum of the stage delay variations, and
d_T2 is the root-mean-square of the stage delay variations.

10. The computer readable storage medium of claim 7 wherein the weighting function in step (e) is calculated according to the equation $$K(n) = \begin{cases} 1 & \text{if} \quad n \leq r \\ \frac{1}{(n-r)^m} & \text{if} \quad n > r \\ 0 & \text{if} \quad n > r\_up \end{cases}$$

wherein r and r_up are integers such that $0<r<r\_up<n$, $K(n)$ is the weighting function, n is a number of stage delays, and $0<m\leq 1$.

11. The computer readable storage medium of claim 7 wherein step (d) comprises omitting, from the calculation of the root sum square of the stage delay variations, each stage delay variation having a value less than a selected minimum ratio of the value of the stage delay variation to the sum of the stage delays.

12. The computer readable storage medium of claim 11 wherein the selected minimum ratio has a value equal to about 0.001.

* * * * *